(12) United States Patent
Kremer

(10) Patent No.: US 12,124,172 B2
(45) Date of Patent: Oct. 22, 2024

(54) LITHOGRAPHIC APPARATUS AND ULTRAVIOLET RADIATION CONTROL SYSTEM

(71) Applicant: ASML Holding N.V., Veldhoven (NL)

(72) Inventor: Alexander Kremer, Stamford, CT (US)

(73) Assignee: ASML Holding N.V., Veldhoven (NL)

( * ) Notice: Subject to any disclaimer, the term of this patent is extended or adjusted under 35 U.S.C. 154(b) by 62 days.

(21) Appl. No.: 17/634,702

(22) PCT Filed: Aug. 5, 2020

(86) PCT No.: PCT/EP2020/072062
§ 371 (c)(1),
(2) Date: Feb. 11, 2022

(87) PCT Pub. No.: WO2021/028295
PCT Pub. Date: Feb. 18, 2021

(65) Prior Publication Data
US 2022/0291594 A1  Sep. 15, 2022

Related U.S. Application Data

(60) Provisional application No. 62/886,532, filed on Aug. 14, 2019.

(51) Int. Cl.
*G03F 7/20* (2006.01)
*G01J 3/02* (2006.01)
(Continued)

(52) U.S. Cl.
CPC .......... *G03F 7/70558* (2013.01); *G01J 3/021* (2013.01); *G01J 3/0291* (2013.01); *G01J 3/4406* (2013.01); *G03F 7/7085* (2013.01)

(58) Field of Classification Search
CPC .... G03F 7/70558; G03F 7/7085; G01J 3/021; G01J 3/0291; G01J 3/4406; G01J 1/0474;
(Continued)

(56) References Cited

U.S. PATENT DOCUMENTS

| 4,935,631 A | 6/1990 | Mosley et al. |
| 6,327,284 B1 | 12/2001 | Stamm et al. |

(Continued)

FOREIGN PATENT DOCUMENTS

| JP | H01-502053 A | 7/1989 |
| JP | H02-61524 A | 3/1990 |

(Continued)

OTHER PUBLICATIONS

International Search Report and Written Opinion of the International Searching Authority directed to related International Patent Application No. PCT/EP2020/072062, mailed Nov. 20, 2020; 11 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

The present disclosure provides an ultraviolet radiation control system and a related method for control an ultraviolet radiation in a lithographic apparatus. The ultraviolet radiation control system comprises a housing; a conversion crystal (540), disposed on or in the housing, configured to convert an ultraviolet radiation to a fluorescent radiation; a plurality of photodetectors (550) configured to detect an intensity of a scattered portion of the fluorescent radiation; and at least one diffusive surface (545), disposed on or in the conversion crystal, configured to increase the intensity of the scattered portion of the fluorescent radiation.

20 Claims, 10 Drawing Sheets

(51) Int. Cl.
*G01J 3/44* (2006.01)
*G03F 7/00* (2006.01)

(58) Field of Classification Search
CPC .. G01J 1/4228; G01J 2001/061; G01J 1/4257; G01J 1/429
See application file for complete search history.

(56) References Cited

U.S. PATENT DOCUMENTS

| | | |
|---|---|---|
| 7,511,799 B2 | 3/2009 | Tel et al. |
| 7,554,093 B1 | 6/2009 | Ganopoulos et al. |
| 9,823,121 B2 | 11/2017 | Sun et al. |
| 10,082,424 B2 | 9/2018 | Godfried |
| 2013/0010282 A1 | 1/2013 | Yamatani |
| 2014/0158892 A1 | 6/2014 | Berezhnyy |
| 2015/0168848 A1 | 6/2015 | Tanaka et al. |

FOREIGN PATENT DOCUMENTS

| | | |
|---|---|---|
| JP | H08-292091 A | 11/1996 |
| JP | H09-210771 A | 8/1997 |
| JP | H11-277259 A | 10/1999 |
| JP | H11-304581 A | 11/1999 |
| JP | 2000-151001 A | 5/2000 |
| JP | 2000-258247 A | 9/2000 |
| JP | 2002-365141 A | 12/2002 |
| JP | 2005-352250 A | 12/2005 |
| JP | 2006-211234 A | 8/2006 |
| JP | 2007-142361 A | 6/2007 |
| JP | 2011-198609 A | 10/2011 |
| JP | 2017-515151 A | 6/2017 |
| JP | 2017-539078 A | 12/2017 |

OTHER PUBLICATIONS

International Preliminary Report on Patentability directed to related International Patent Application No. PCT/EP2020/072062, issued Feb. 8, 2022; 8 pages.

Chinese Office Action directed to Chinese Patent Application No. 202080057089.9, mailed Apr. 18, 2024; 16 pages.

LITHOGRAPHIC APPARATUS AND ULTRAVIOLET RADIATION CONTROL SYSTEM

CROSS-REFERENCE TO RELATED APPLICATIONS

This application claims priority of U.S. provisional patent application 62/886,532, which was filed on Aug. 14, 2019, and which is incorporated herein in its entirety by reference.

FIELD

The present disclosure relates to a lithographic apparatus and an ultraviolet radiation control system, for example, a system for control an ultraviolet radiation in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

A deep ultraviolet (DUV) radiometer is used in a DUV dose control system of the lithographic apparatus to measure the power of beams of DUV radiation. Such DUV beam is typically produced by a laser, and the power of DUV laser beam is measured so that calibration of the laser is assured and adjusted if required. If the power of a laser is not accurately measured, the laser may not perform as desired in delicate or precision uses. In a DUV radiometer, a small portion of the main beam of DUV radiation is branched off and converted to a fluorescent radiation. A measuring of the fluorescent radiation indirectly measures the power of the incident beam of DUV radiation.

However, conventional collection of the fluorescent radiation is not done effectively nor done in a well-controlled manner. Accordingly, it is desirable to introduce a more robust and reproducible system for collecting florescence light in the DUV dose control system of a lithographic apparatus so that the fluorescent light collection efficiency can be increased for enhancing a precise control of the DUV radiation, while simultaneously reducing the manufacturing cost of the DUV dose control system of the lithographic apparatus.

SUMMARY

One aspect of the present disclosure provides an ultraviolet radiation control system. The system comprises: a housing; a conversion crystal, disposed on or in the housing, configured to convert an ultraviolet radiation to a fluorescent radiation; a plurality of photodetectors configured to detect an intensity of a scattered portion of the fluorescent radiation; and at least one diffusive surface, disposed on or in the conversion crystal, configured to increase the intensity of the scattered portion of the fluorescent radiation.

In some embodiments, the at least one diffusive surface is disposed spatially close to the plurality of photodetectors.

In some embodiments, the ultraviolet radiation control system comprises only a single conversion crystal.

In some embodiments, the conversion crystal comprises a disk shape; and the plurality of photodetectors are evenly spaced about an annular peripheral edge of the conversion crystal.

In some embodiments, the at least one diffusive surface comprises a ring shape.

In some embodiments, the at least one diffusive surface comprises a plurality of segments arranged in a discontinuous ring shape, each of the plurality of segments is located adjacent a given one of the plurality of photodetectors.

In some embodiments, the plurality of photodetectors are disposed at a first side of the conversion crystal; and the at least one diffusive surface is disposed at a second side of the conversion crystal that is opposite to the first side.

In some embodiments, the plurality of photodetectors are disposed at a first side of the conversion crystal; and the at least one diffusive surface is disposed at the first side of the conversion crystal.

In some embodiments, the plurality of photodetectors are disposed at a first side of the conversion crystal; and the at least one diffusive surface comprises a first diffusive surface disposed at the first side of the conversion crystal, and a second diffusive surface is disposed at a second side of the conversion crystal that is opposite to the first side.

In some embodiments, the plurality of photodetectors are disposed so as to surround the annular peripheral edge of the conversion crystal; and the at least one diffusive surface is located at the annular peripheral edge of the conversion crystal.

In some embodiments, the ultraviolet radiation is a deep ultraviolet radiation.

In some embodiments, the ultraviolet radiation is a branched beam from a 193 nm excimer pulsed laser.

In some embodiments, the plurality of photodetectors are disposed on a ring shape spacer that is disposed on an insulator.

In some embodiments, the ultraviolet radiation control system further comprises a light dump or a mirror located in a center of the ring shape spacer and configured to reflect a portion of the ultraviolet radiation transmitted from the conversion crystal back to the conversion crystal to increase an amount of fluorescent radiation converted from the ultraviolet radiation.

In some embodiments, the housing is configured to protect the conversion crystal and the plurality of photodetectors. The ultraviolet radiation control system further comprises: a purge cap fixed on the housing, and a purge channel located within the purge cap or between the housing and the purge cap.

In some embodiments, the ultraviolet radiation control system further comprises a first seal, a plurality of springs, and a crystal spring holder arranged between the purge cap and the insulator.

In some embodiments, the ultraviolet radiation control system further comprises a second seal and a centering O-ring arranged between the conversion crystal and the crystal housing.

In some embodiments, the at least one diffusive surface includes impurities embedded in layer of the conversion crystal configured to scattering the fluorescent radiation.

Another aspect of the present disclosure provides a lithographic apparatus, comprising the disclosed ultraviolet radiation control system.

Another aspect of the present disclosure provides a method for measuring an ultraviolet radiation. The method comprises: using a conversion crystal to convert a branched portion of the ultraviolet radiation to a fluorescent radiation; using at least one diffusive surface disposed on or in the conversion crystal to scatter the fluorescent radiation; and using a plurality of photodetectors to measure an intensity of the scattered fluorescent radiation.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
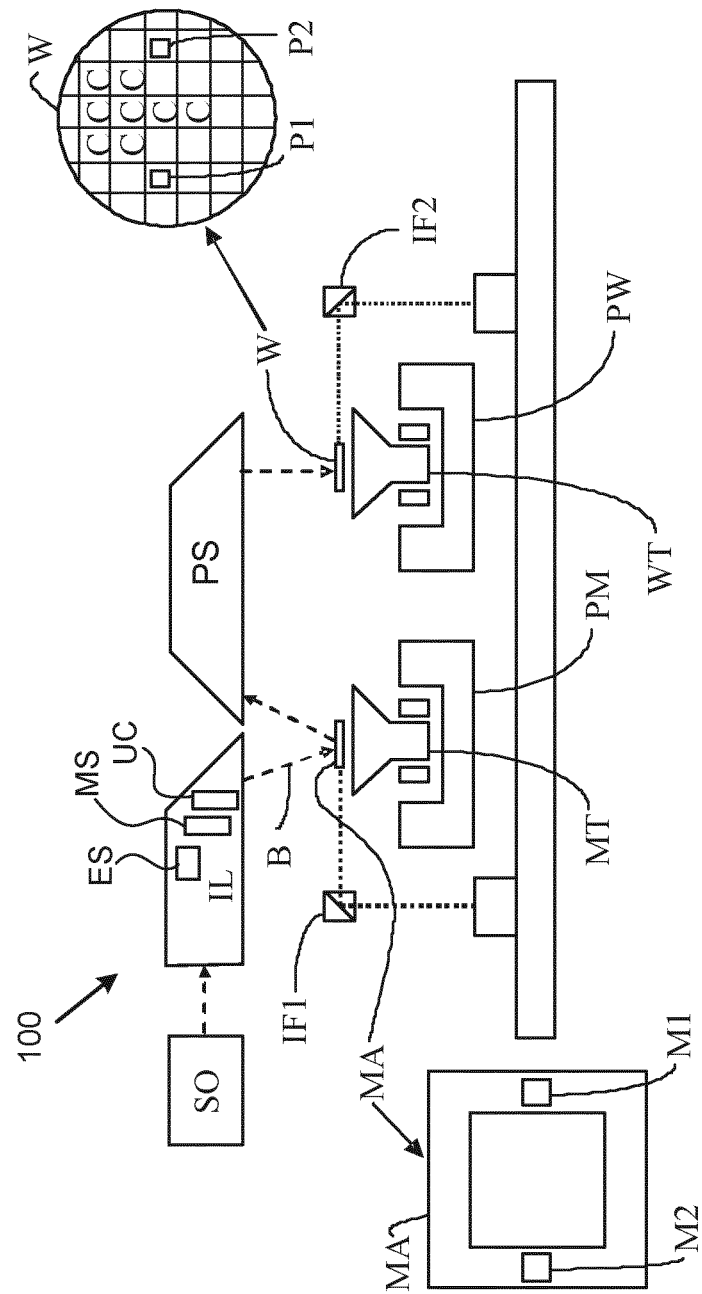
FIG. 1 shows a schematic of a lithographic apparatus, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 2:
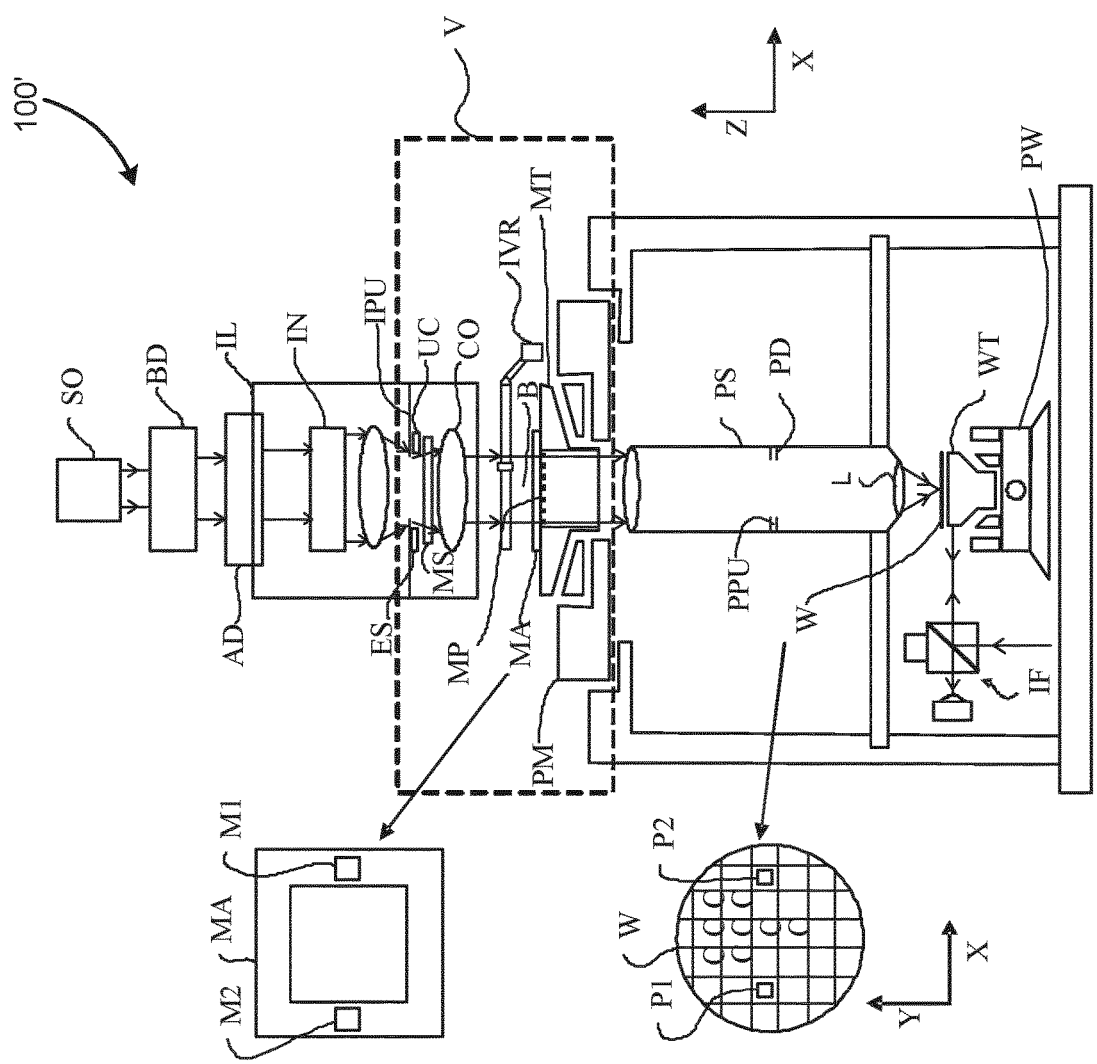
FIG. 2 shows a schematic of a transmissive lithographic apparatus, according to some embodiments.

FIGS. 1 and 2 show schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B, such as a deep ultraviolet (DUV) radiation; a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS can be either reflective or transmissive. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B. The illumination system IL can also include an energy sensor ES that provides a measurement of, for example, one or more of energy per pulse, photon energy, intensity, average power, and the like. Illumination system IL can include a measurement sensor MS for measuring a movement of the radiation beam B and uniformity compensators UC that allow an illumination slit uniformity to be controlled.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some embodiments, the patterning device MA compatible with a DUV source can be transmissive as in lithographic apparatus 100' of FIG. 2. Examples of patterning devices MA include reticles, masks, programmable mirror arrays, or programmable LCD panels.

Masks are well known in lithography, and include mask types such as binary, alternating phase shift, or attenuated phase shift, as well as various hybrid mask types. The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for DUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1 and 2, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 2) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 2) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 2), such as an integrator IN and a condenser CO. The illuminator IL can be used to condition the radiation beam B to have a desired uniformity and intensity distribution in its cross section. The desired uniformity of radiation beam B can be maintained by using a uniformity compensator UC. Uniformity compensator UC comprises a plurality of protrusions (e.g., fingers) that can be adjusted in the path of radiation beam B to control the uniformity of radiation beam B. A sensor ES can be used to monitor the uniformity of radiation beam B.

Referring to FIG. 1, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 2, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU. A desired uniformity of radiation beam B can be maintained by using a uniformity compensator UC to control a uniformity of the radiation beam B. A sensor ES can be used to monitor the uniformity of radiation beam B.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 2) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of the vacuum chamber V. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

Exemplary Energy Sensor

Figure 3:
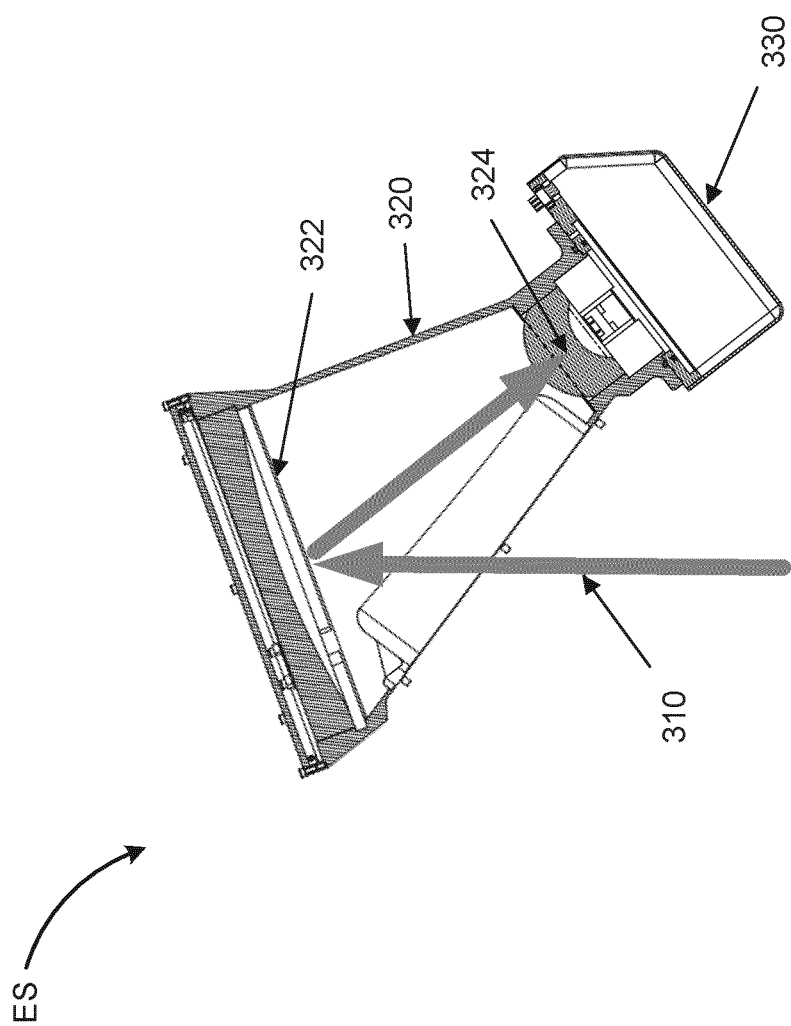
FIG. 3 shows a schematic of an energy sensor ES, according to some embodiments.

FIG. 3 shows a schematic of an energy sensor ES, according to some embodiments. In some embodiments, the energy sensor ES is a key component of a dose control sub-system of the illumination system IL, and configured to provide a measurement of radiation beam B, such as a DUV radiation beam. The energy sensor ES can be located at a middle point of the illumination optical train. A small portion (e.g., about 1%) of radiation beam B—the DUV radiation beam 310 as shown in FIG. 3, can be branched off and delivered into a housing 320 of energy sensor ES. In one example, the DUV radiation beam 310 can be a 193 nm excimer laser radiation beam. The DUV radiation beam 310 can be then focused by mirrors 322 and lens 324 onto a detector module 330.

Figure 4:
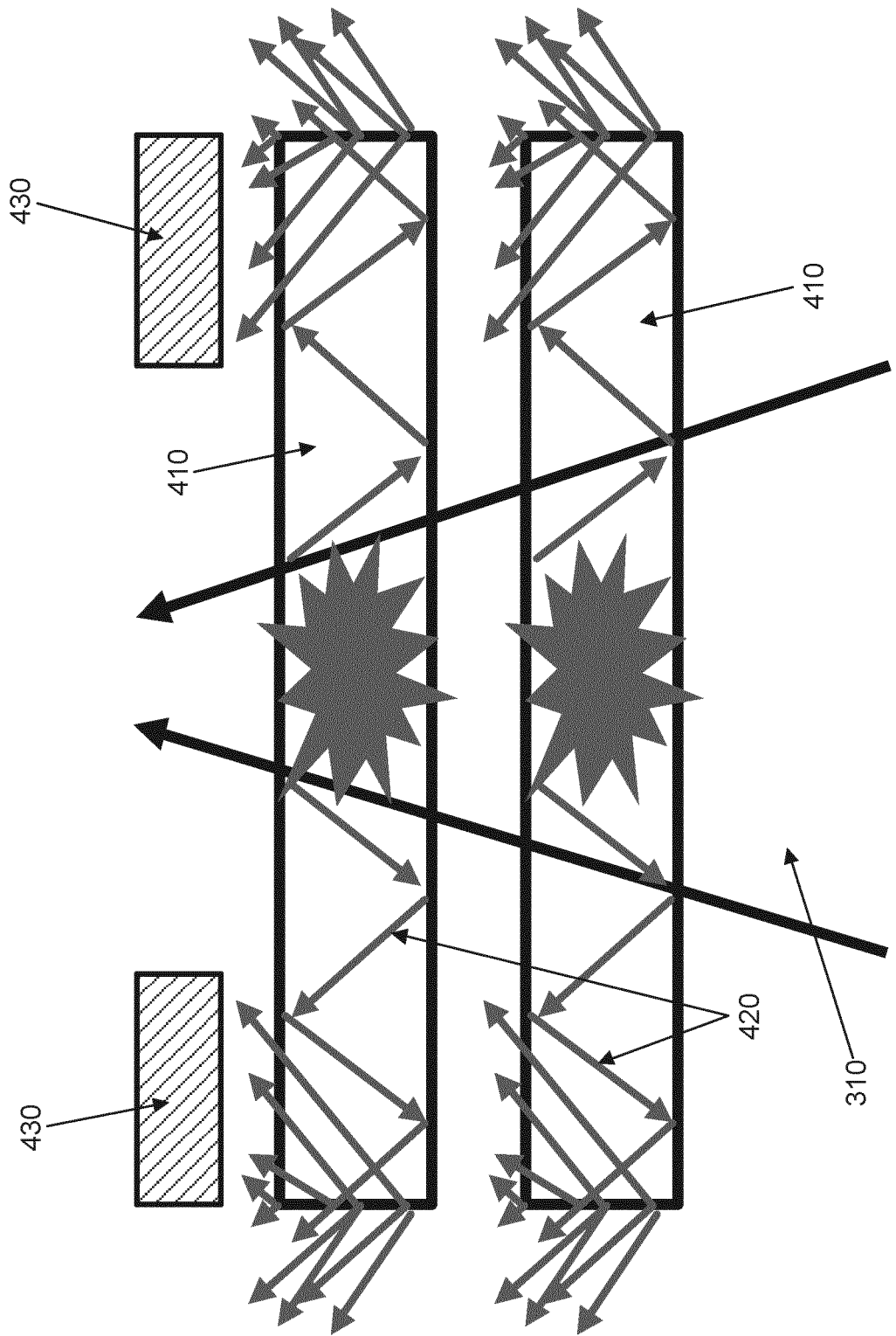
FIG. 4 shows a schematic cross-sectional view of an existing energy sensor.

As shown in FIG. 4, in some existing energy sensor ES, the detector module 330 includes two sandwiched thin disk shape crystals 410 configured to absorb a portion the DUV radiation beam 310 and convert it into longer wavelength radiation. In some embodiments, crystals 410 can be sapphire crystals which can covert DUV radiation into fluorescence radiation 420, such as visible light or infrared radiation IR. The fluorescence radiation 420 born at the central area of the crystals 410 which is exposed to the DUV radiation beam 310 propagates inside each crystal 410 to its edges by internal total reflection. The fluorescence radiation 420 can be detected by multiple photodetectors 430, like Si diodes.

The multiple photodetectors 430 can be positioned along the perimeter of the crystal to homogenize the fluorescent radiation to increase the useful signal. However, the collection of the fluorescent radiation 420 by the multiple photodetectors 430 is not effective. As shown in FIG. 4, the fluorescent radiation 420 experiences multiple bounces from the both surfaces of the disk shape crystals 410 and propagates to the edges from the center. Assuming that the surfaces of the crystals 410 are ideally polished and flat, a ray of the fluorescent light having angle with the surface exceeding the angle of the internal total reflection will reach the edge of crystals 410 intact. At the edge the fluorescent radiation 420 leaks out by the means of scatter and only a small portion can be picked up by the photodetectors 430. The efficiency of the fluorescent light collection in such an arrangement is relatively low and the amount of the collected fluorescence depends on the quality of the edge of crystals 410. Therefore, the present disclosure provides a new design of the detector module that can increase the fluorescent light collection efficiency.

Figure 5:
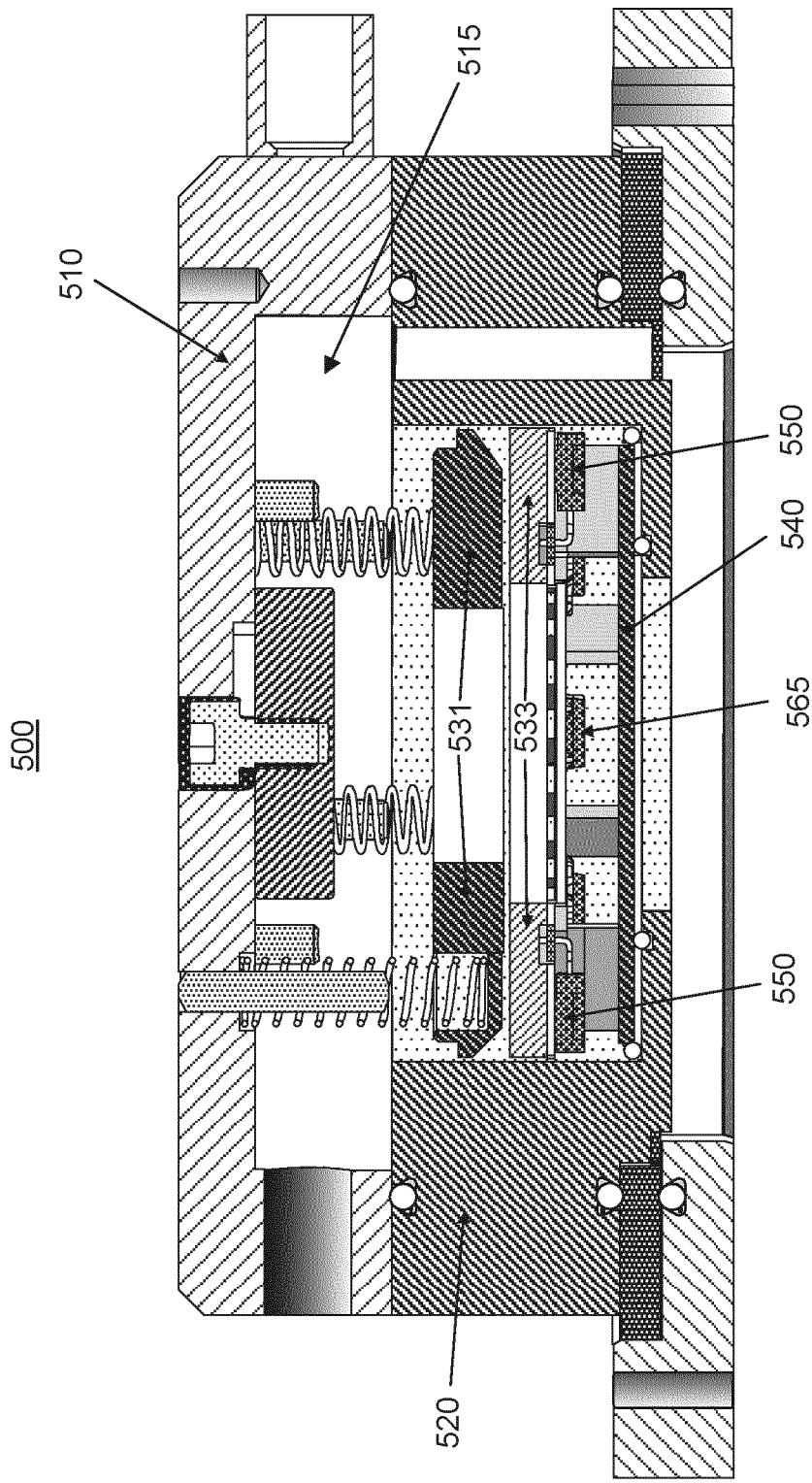
FIG. 5 shows a schematic cross-sectional view of an exemplary detector module of the energy sensor in accordance with some embodiments.
Figure 6:
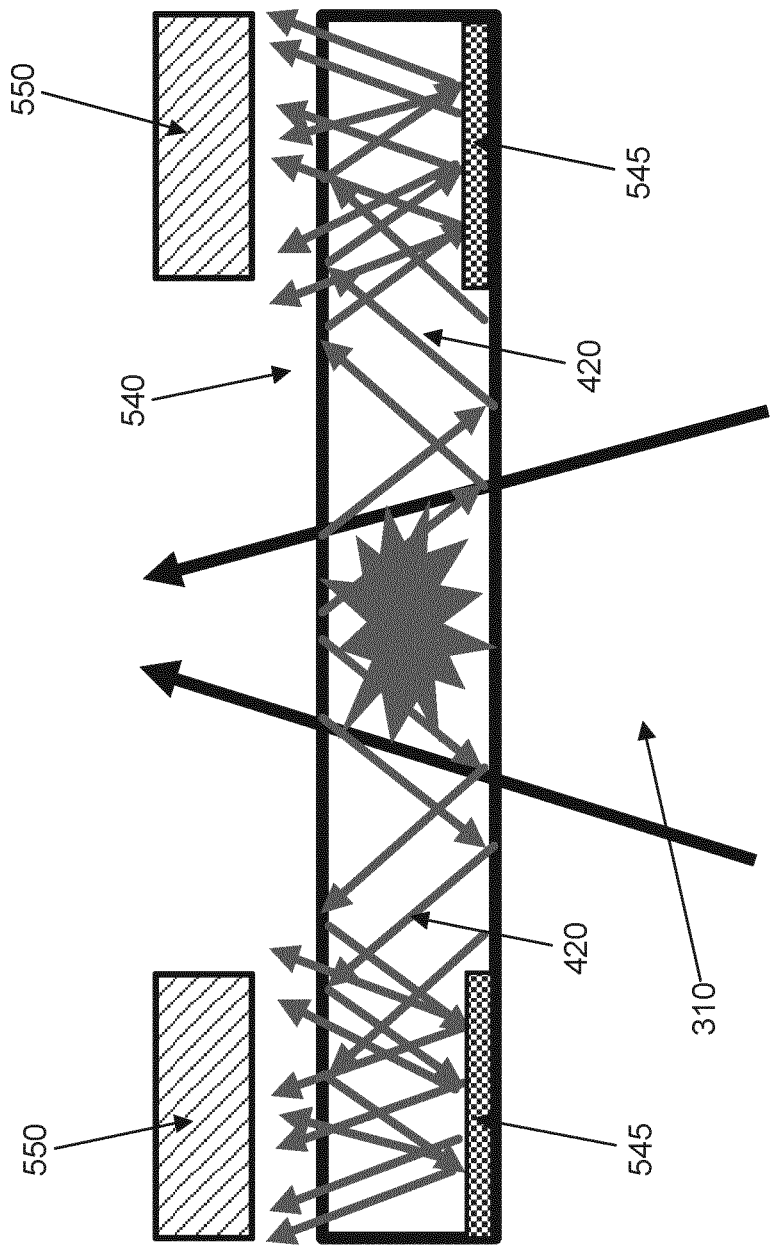
FIG. 6 shows a schematic cross-sectional view of a conversion crystal and multiple photodetectors of the exemplary detector module of FIG. 5 in accordance with some embodiments.
Figure 7:
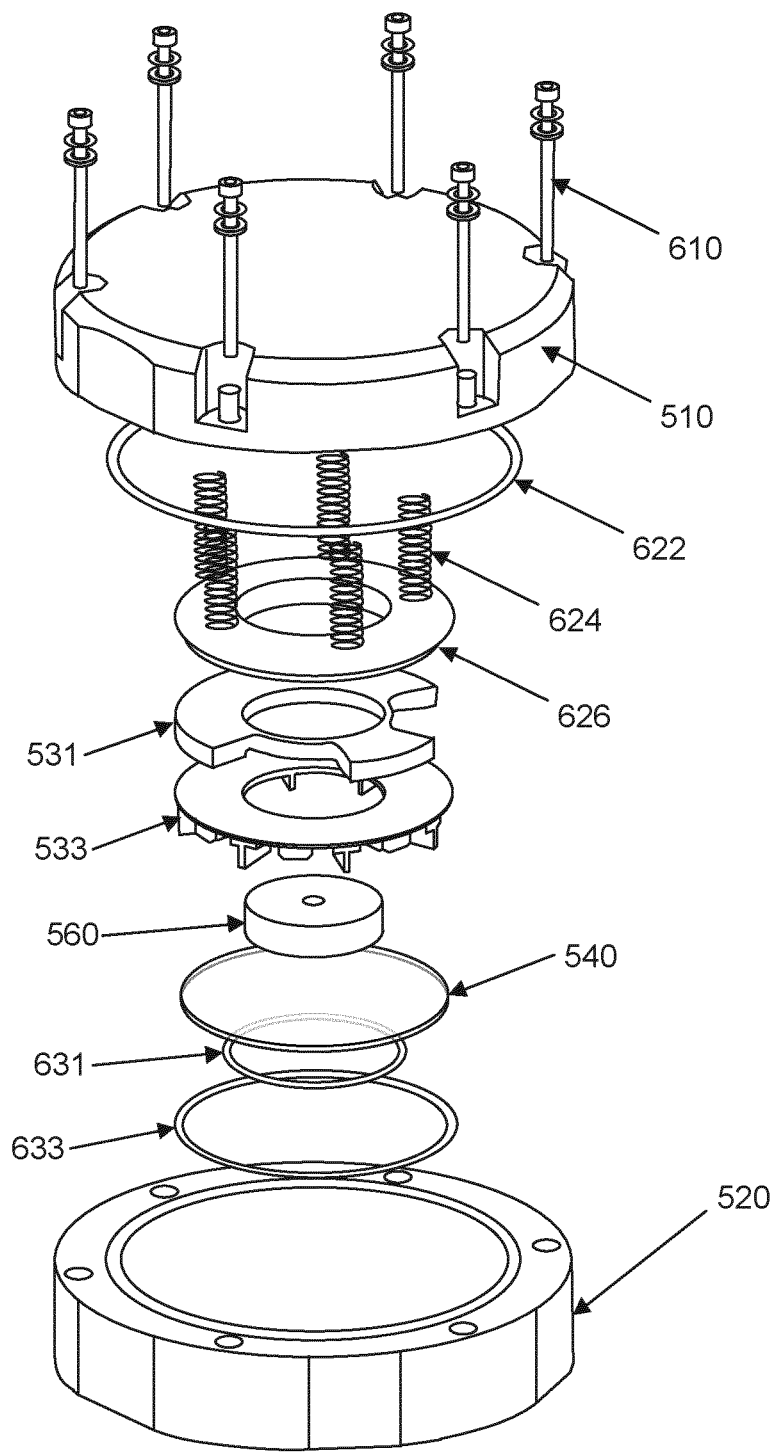
FIG. 7 shows a schematic exploded perspective view of the exemplary detector module of FIG. 5 in accordance with some embodiments.
Figure 8:
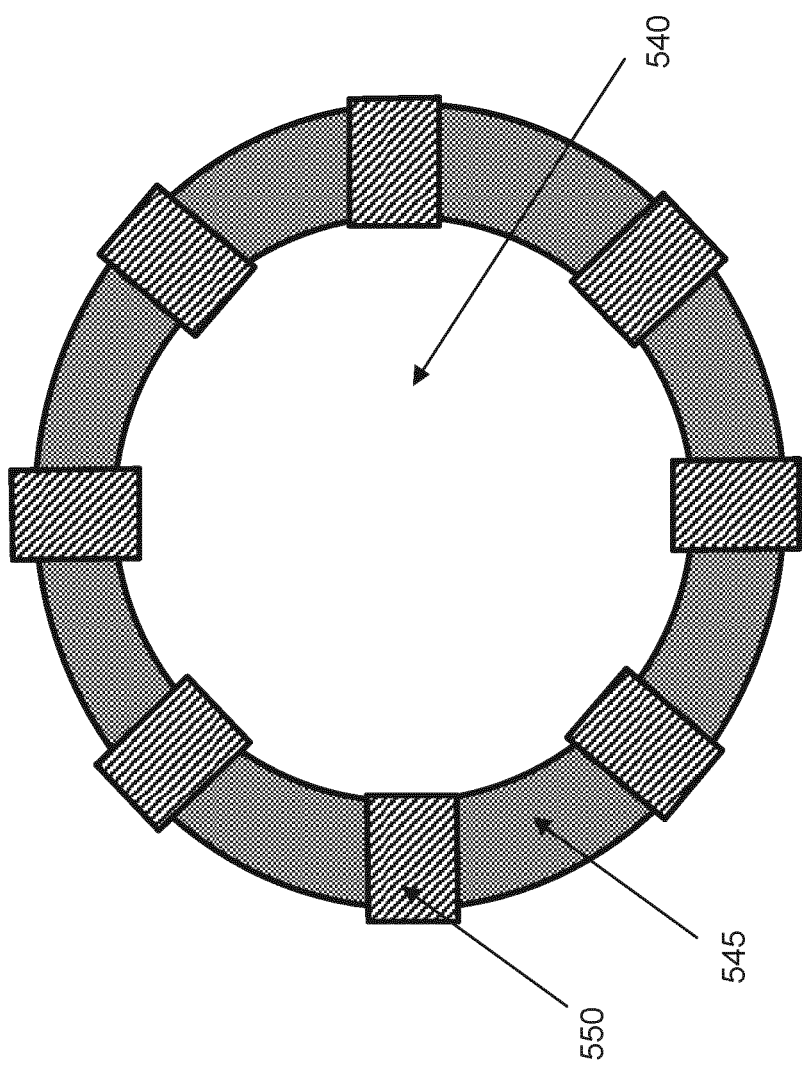
FIG. 8 shows a schematic top view of a conversion crystal and multiple photodetectors of the exemplary detector module of FIG. 5 in accordance with some embodiments.

Referring to FIGS. 5-8, FIG. 5 shows a schematic cross-sectional view of an exemplary detector module 500 of the energy sensor in accordance with some embodiments, FIG. 6 shows a schematic exploded perspective view of the exemplary detector module 500 of FIG. 5 in accordance with some embodiments, FIG. 7 shows a schematic cross-sectional view of a conversion crystal and multiple photodetectors of the detector module 500 of FIG. 5, and FIG. 8 shows a schematic top view of a conversion crystal and multiple photodetectors of the exemplary detector module 500 of FIG. 5.

As shown in FIG. 5, the detector module 500 can include a purge cap 510 and a crystal housing 520. A purge channel 515 can be formed in the purge cap 510 or between purge cap 510 and crystal housing 520. A conversion crystal 540 can be located in the crystal housing 520.

In some embodiments, the conversion crystal 540 can be a disk shape crystal having a distribution of fluorescent impurities. The conversion crystal 540 can be any crystal having any fluorescent impurities and the crystal can be selectively doped as necessary to enhance response to various wavelengths of an incident beam of ultraviolet radiation. For example, the crystal can be a sapphire crystal. The fluorescent impurities can include un-doped oxide crystals and/or rare earth doped crystals. In one example, rare earth doped garnets, such as $Ce^{3+}:Y_3AL_5O_{12}$(YAG), can be used as the fluorescent impurities. The rare earth doped garnets can also include other rare earth elements, such as neodymium (Nd), lanthanum (La) and Europium (Eu), etc. In some embodiments, the conversion crystal 540 can be a sapphire crystal doped with Titanium.

The conversion crystal 540 can be positioned such that a center of the conversion crystal 540 is able to be exposed under an DUV radiation beam 310, as shown in FIG. 6. The conversion crystal 540 can convert the DUV radiation beam 310 to fluorescent radiation 420 in response to and in proportion to the power of the DUV radiation beam 310. In some embodiments, slow crystals may not be suitable for conversion crystal 540, since the fluorescence life time is short, e.g., less than 5 microsecond, thus the E-sensor must detect each pulse and frequency of laser at a frequency of 6 kHz.

Multiple photodetectors 550 can be mounted on a ring shape spacer 533 that is attached on an insulator 531, and are configured to measure an intensity of a scattered portion of the fluorescent radiation 420. In some embodiments, the Multiple photodetectors 550 can be evenly spaced apart about the ring shape spacer 533 and are therefore also evenly spaced about the annular peripheral edge of the conversion crystal 540. Based on the measuring result of the multiple photodetectors 550, the power of the DUV radiation beam 310 can be determined, and the power of radiation beam B as shown in FIGS. 1 and 2 can be also determined. As such, a calibration of the pulsed radiation source SO can be assured and adjusted if desired.

Further, in some embodiments, a light dump 560 or alternatively light dump 560 can comprise a mirror located in the center of the ring shape spacer 533, and can be configured to send transmitted UV radiation 565 back to conversion crystal 540 to increase the amount of fluorescent radiation 420 converted from the UV radiation.

In some embodiments, as shown in FIG. 7, the purge cap 510 can be fixed on the crystal housing 520 by fastener 610, such as clips or screws, or the like. A first sealing O-ring 622, multiple springs 624 and crystal spring holder 626 can be arranged between the purge cap 510 and the insulator 531. The photodetectors 550 can be attached on a bottom of the ring shape spacer 533. A second sealing O-ring 631 and a centering O-ring 633 can be arranged between the conversion crystal 540 and the crystal housing 520. The multiple springs 624 can fasten the multiple components between the purge cap 510 and the crystal housing 520.

As shown in FIG. 6, a portion of surface of conversion crystal 540 close to the annular peripheral edge of conversion crystal 540 where the multiple photodetectors 550 are located can be treated to form a diffusive surface 545. For example, a dull polish process, a metalized process, or any other suitable process can be performed to form the diffusive surface 545. The diffusive surface 545 can scatter the fluorescent radiation 420 thus serves as an internal total reflection destroyer. The fluorescent radiation 420 scattered at the diffusive surface 545 reaches the multiple photodetectors 550 can significantly increase the intensity of the signal detected by the multiple photodetectors 550. Thus, a single conversion crystal 540 can provide enough amount of fluorescent radiation 420 to be collected by the multiple photodetectors 550.

In some embodiments, the diffusive surface 545 can have a ring shape, as shown in FIG. 8. In some alternative embodiments, the diffusive surface 545 can have a discontinuous ring shape (not shown). That is, the diffusive surface 545 includes multiple segments each located corresponding to a photodetector 550. The polished surfaces of the conversion crystal 540 in between of the multiple segments of the diffusive surface 545 can take part in further light mixing by internal total reflection. Thus such arrangement can further reduce the waste of the scattered fluorescent radiation 420, thereby further increasing fluorescent light collection efficiency of the multiple photodetectors 550.

In some embodiments, the diffusive surface 545 can be located on a distal side of the conversion crystal 540 that is opposite to the multiple photodetectors 550, as shown in FIG. 6. In some other embodiments, the diffusive surface 545 can be located on a proximal side of the conversion crystal 540 that is close to the multiple photodetectors 550.

Figure 9:
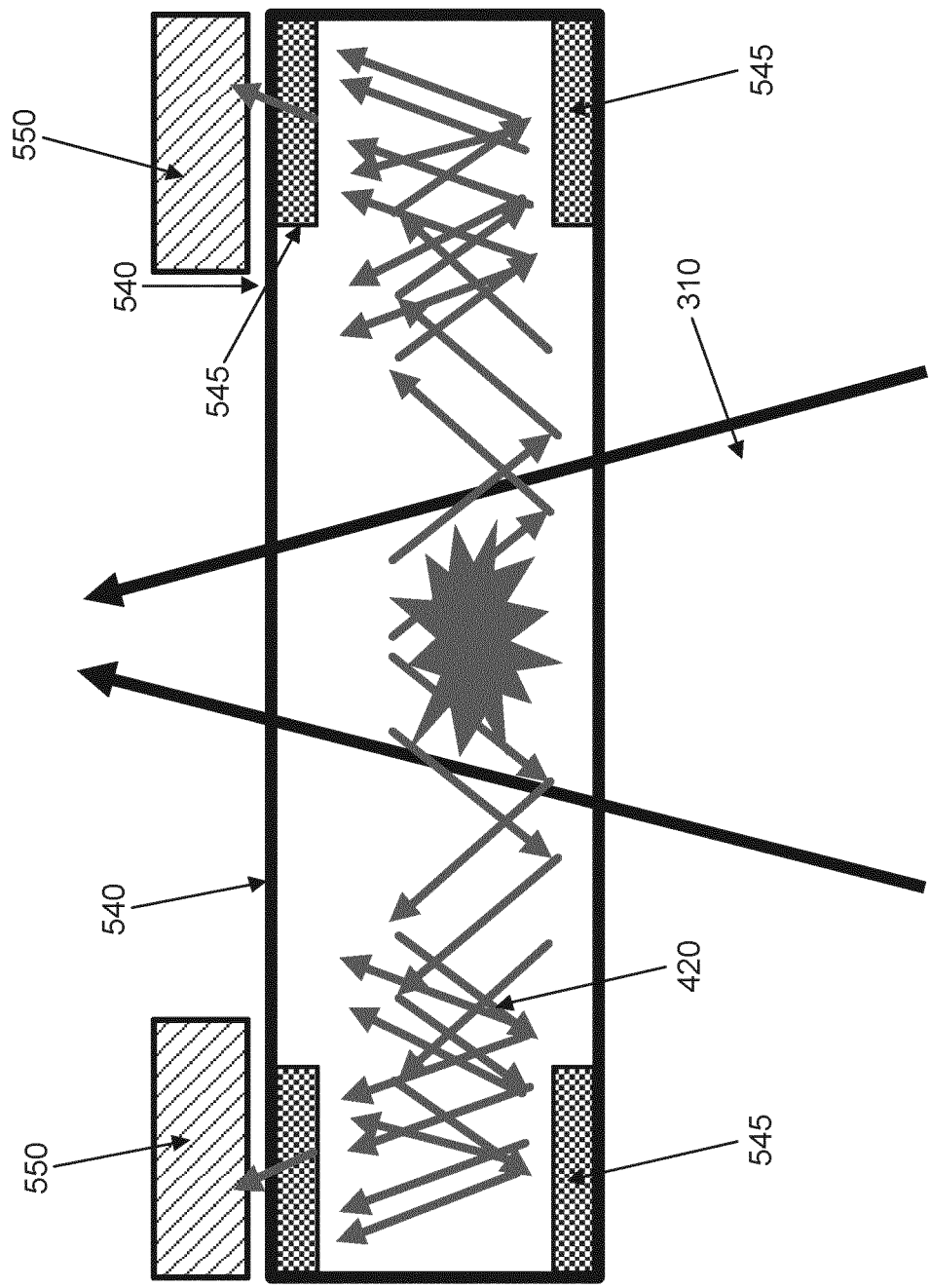
FIG. 9 shows a schematic cross-sectional view of a conversion crystal and multiple photodetectors of an exemplary detector module in accordance with some other embodiments.
Figure 10:
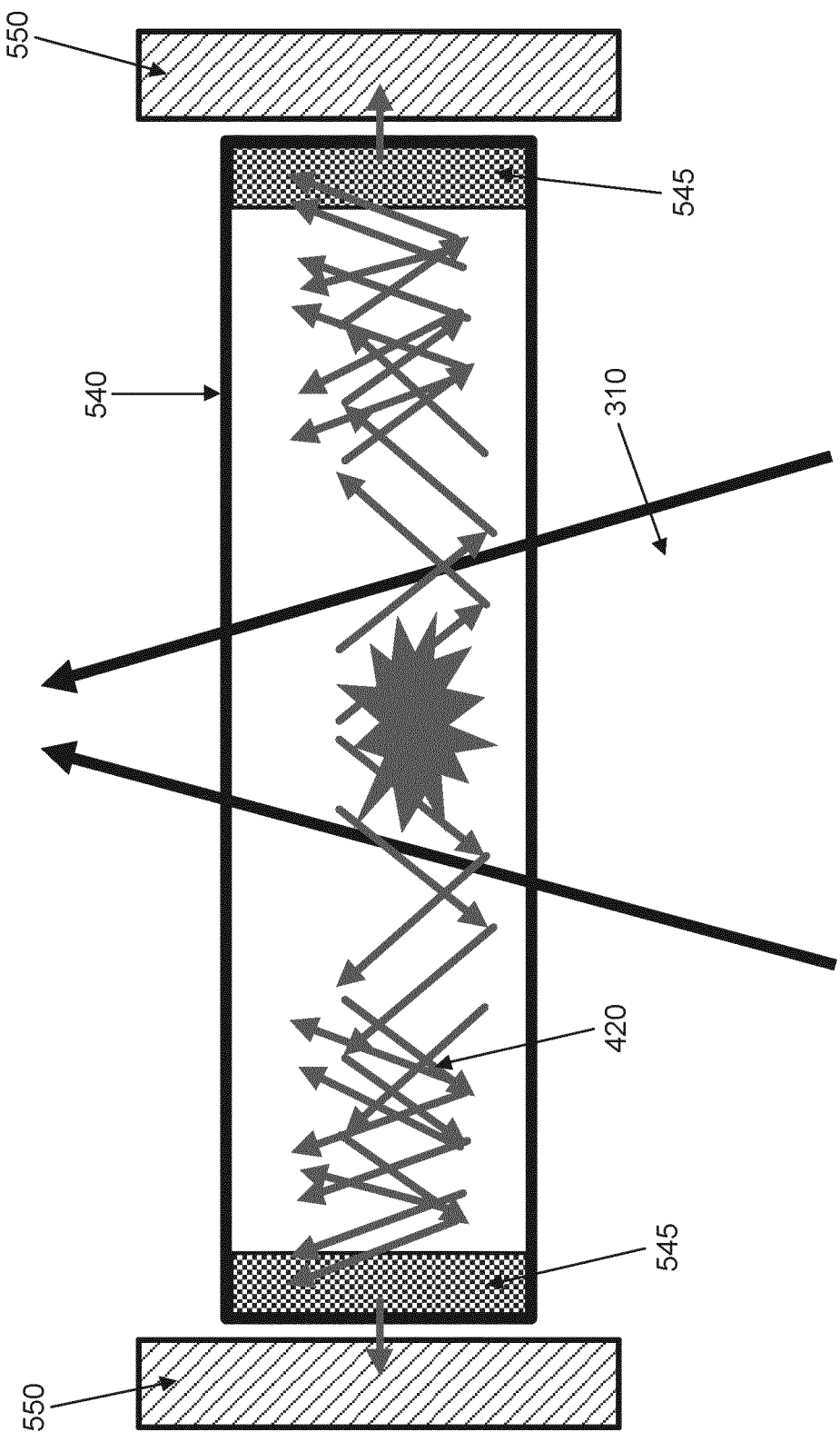
FIG. 10 shows a schematic cross-sectional view of a conversion crystal and multiple photodetectors of another exemplary detector module in accordance with some other embodiments.

Referring to FIGS. 9 and 10, a schematic cross-sectional view of a conversion crystal and multiple photodetectors of exemplary detector modules are illustrated in accordance with some other embodiments.

As shown in FIG. 9, in some other embodiments, two diffusive surfaces 545 can be formed on both sides of the conversion crystal 540. A first diffusive surface can be located on a distal side of the conversion crystal 540 that is opposite to the multiple photodetectors 550, and a second diffusive surface can be located on a proximal side of the conversion crystal 540 that is close to the multiple photodetectors 550.

In some alternative embodiments, the diffusive surface 545 can include impurities (also called scattering particles) embedded in a portion of the conversion crystal 540 that corresponds to the multiple photodetectors 550. In some embodiments, the conversion crystal 540 can be layered, such that the impurities can be isolated to a layer of the conversion crystal. The layer can be sandwiched by crystal layers without impurities or located at a top layer or a bottom later, or other configuration (e.g., multiple isolated layers with scattering particles) so long as sufficient reflection is achieved for efficient detection of the fluorescent radiation 420 by the multiple photodetectors 550.

As shown in FIG. 10, in some other embodiments, the multiple photodetectors 550 can be arranged around the annular peripheral edge of the conversion crystal 540. The diffusive surface 545 can cover the annular peripheral edge of the conversion crystal 540, and the corners to both sides of the conversion crystal 540.

In some embodiments, any other suitable arrangements can be used to further increase the fluorescent light collection efficiency of the multiple photodetectors 550. For example, a reflective coating can be formed on the diffusive surface 545 to increase the effect of light scatter. As another example, the multiple photodetectors 550 can be placed at an angle to the surface of the conversion crystal 540 to optimize the fluorescent light collection efficiency.

Accordingly, by increasing the fluorescent light collection efficiency, the disclosed energy sensor ES switches from the existing two crystals design to a single crystal design which produces more intensive signal (e.g., 30% more intensity). Therefore, the disclosed energy sensor ES provides a more robust and reproducible system for collecting florescence light in the ultraviolet radiation control system of a lithographic apparatus, thereby ensuring a precise control of the ultraviolet radiation, and simultaneously reducing the manufacturing cost of the ultraviolet radiation control system of the lithographic apparatus.

In some embodiments, the disclosed ultraviolet radiation control system comprises a housing; a conversion crystal, disposed on or in the housing, configured to convert an ultraviolet radiation to a fluorescent radiation; a plurality of photodetectors configured to detect an intensity of a scattered portion of the fluorescent radiation; and at least one diffusive surface, disposed on or in the conversion crystal, configured to increase the intensity of the scattered portion of the fluorescent radiation.

In some embodiments, the at least one diffusive surface is disposed spatially close to the plurality of photodetectors.

In some embodiments, the ultraviolet radiation control system comprises only a single conversion crystal.

In some embodiments, the conversion crystal comprises a disk shape; and the plurality of photodetectors are evenly spaced about an annular peripheral edge of the conversion crystal.

In some embodiments, the at least one diffusive surface comprises a ring shape.

In some embodiments, the at least one diffusive surface comprises a plurality of segments arranged in a discontinuous ring shape, each of the plurality of segments is located adjacent a given one of the plurality of photodetectors.

In some embodiments, the plurality of photodetectors are disposed at a first side of the conversion crystal; and the at least one diffusive surface is disposed at a second side of the conversion crystal that is opposite to the first side.

In some embodiments, the plurality of photodetectors are disposed at a first side of the conversion crystal; and the at least one diffusive surface is disposed at the first side of the conversion crystal.

In some embodiments, the plurality of photodetectors are disposed at a first side of the conversion crystal; and the at least one diffusive surface comprises a first diffusive surface disposed at the first side of the conversion crystal, and a second diffusive surface is disposed at a second side of the conversion crystal that is opposite to the first side.

In some embodiments, the plurality of photodetectors are disposed so as to surround the annular peripheral edge of the conversion crystal; and the at least one diffusive surface is located at the annular peripheral edge of the conversion crystal.

In some embodiments, the ultraviolet radiation is a deep ultraviolet radiation.

In some embodiments, the ultraviolet radiation is a branched beam from a 193 nm excimer pulsed laser.

In some embodiments, the plurality of photodetectors are disposed on a ring shape spacer that is disposed on an insulator.

In some embodiments, the ultraviolet radiation control system further comprises a light dump or a mirror located in a center of the ring shape spacer and configured to reflect a portion of the ultraviolet radiation transmitted from the conversion crystal back to the conversion crystal to increase an amount of fluorescent radiation converted from the ultraviolet radiation.

In some embodiments, the housing is configured to protect the conversion crystal and the plurality of photodetectors. The ultraviolet radiation control system further comprises: a purge cap fixed on the housing, and a purge channel located within the purge cap or between the housing and the purge cap.

In some embodiments, the ultraviolet radiation control system further comprises a first seal, a plurality of springs, and a crystal spring holder arranged between the purge cap and the insulator.

In some embodiments, the ultraviolet radiation control system further comprises a second seal and a centering O-ring arranged between the conversion crystal and the crystal housing.

In some embodiments, the at least one diffusive surface includes impurities embedded in layer of the conversion crystal configured to scattering the fluorescent radiation.

Another aspect of the present disclosure provides a lithographic apparatus, comprising the disclosed ultraviolet radiation control system.

Another aspect of the present disclosure provides a method for measuring an ultraviolet radiation. The method comprises: using a conversion crystal to convert a branched portion of the ultraviolet radiation to a fluorescent radiation; using at least one diffusive surface disposed on or in the conversion crystal to scatter the fluorescent radiation; and using a plurality of photodetectors to measure an intensity of the scattered fluorescent radiation.

Other aspects of the invention are set out in the following numbered clauses.

1. An ultraviolet radiation control system, comprising:
    a housing;
    a conversion crystal, disposed on or in the housing, configured to convert an ultraviolet radiation to a fluorescent radiation;
    a plurality of photodetectors configured to detect an intensity of a scattered portion of the fluorescent radiation; and
    at least one diffusive surface, disposed on or in the conversion crystal, configured to increase the intensity of the scattered portion of the fluorescent radiation.
2. The ultraviolet radiation control system of clause 1, wherein:
    the at least one diffusive surface is disposed spatially close to the plurality of photodetectors.
3. The ultraviolet radiation control system of clause 1 comprises only a single conversion crystal.
4. The ultraviolet radiation control system of clause 2, wherein:
    the conversion crystal comprises a disk shape; and
    the plurality of photodetectors are evenly spaced about an annular peripheral edge of the conversion crystal.
5. The ultraviolet radiation control system of clause 4, wherein:
    the at least one diffusive surface comprises a ring shape.
6. The ultraviolet radiation control system of clause 4, wherein:
    the at least one diffusive surface comprises a plurality of segments arranged in a discontinuous ring shape, each of the plurality of segments is located adjacent a given one of the plurality of photodetectors.
7. The ultraviolet radiation control system of clause 4, wherein:
    the plurality of photodetectors are disposed at a first side of the conversion crystal; and
    the at least one diffusive surface is disposed at a second side of the conversion crystal that is opposite to the first side.
8. The ultraviolet radiation control system of clause 4, wherein:
    the plurality of photodetectors are disposed at a first side of the conversion crystal; and
    the at least one diffusive surface is disposed at the first side of the conversion crystal.
9. The ultraviolet radiation control system of clause 4, wherein:
    the plurality of photodetectors are disposed at a first side of the conversion crystal; and
    the at least one diffusive surface comprises a first diffusive surface disposed at the first side of the conversion crystal, and a second diffusive surface is disposed at a second side of the conversion crystal that is opposite to the first side.
10. The ultraviolet radiation control system of clause 4, wherein:
    the plurality of photodetectors are disposed so as to surround the annular peripheral edge of the conversion crystal; and
    the at least one diffusive surface is located at the annular peripheral edge of the conversion crystal.
11. The ultraviolet radiation control system of clause 1, wherein:
    the ultraviolet radiation is a deep ultraviolet radiation.
12. The ultraviolet radiation control system of clause 11, wherein:
    the ultraviolet radiation is a branched beam from a 193 nm excimer pulsed laser.
13. The ultraviolet radiation control system of clause 1, wherein:
    the plurality of photodetectors are disposed on a ring shape spacer that is disposed on an insulator.
14. The ultraviolet radiation control system of clause 13, further comprising:
    a light dump or a mirror located in a center of the ring shape spacer and configured to reflect a portion of the ultraviolet radiation transmitted from the conversion crystal back to the conversion crystal to increase an amount of fluorescent radiation converted from the ultraviolet radiation.
15. The ultraviolet radiation control system of clause 13, wherein:
    the housing is configured to protect the conversion crystal and the plurality of photodetectors; and
    the system further comprises:
        a purge cap fixed on the housing, and
        a purge channel located within the purge cap or between the housing and the purge cap.

16. The ultraviolet radiation control system of clause 15, further comprising:
   a first seal, a plurality of springs, and a crystal spring holder arranged between the purge cap and the insulator.
17. The ultraviolet radiation control system of clause 16, further comprising:
   a second seal and a centering O-ring arranged between the conversion crystal and the crystal housing.
18. The ultraviolet radiation control system of clause 1, wherein:
   the at least one diffusive surface includes impurities embedded in layer of the conversion crystal configured to scattering the fluorescent radiation.
19. A lithographic apparatus, comprising the ultraviolet radiation control system of clause 1.
20. A method for measuring an ultraviolet radiation, comprising:
   using a conversion crystal to convert a branched portion of the ultraviolet radiation to a fluorescent radiation;
   using at least one diffusive surface disposed on or in the conversion crystal to scatter the fluorescent radiation; and
   using a plurality of photodetectors to measure an intensity of the scattered fluorescent radiation.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "illumination adjustment apparatus," "radiation correction system," and the like can be used herein to describe an apparatus that adjusts one or more properties of a beam of radiation. For example, a uniformity correction system can be referred to as an illumination adjustment apparatus.

The terms "radiation," "beam," "light," "illumination," and the like as used herein may encompass all types of electromagnetic radiation, for example, ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. An ultraviolet radiation control system, comprising:
   a housing;
   a conversion crystal, disposed on or in the housing, configured to convert an ultraviolet radiation to a fluorescent radiation;
   a plurality of photodetectors configured to detect an intensity of a scattered portion of the fluorescent radiation; and
   at least one diffusive surface, disposed on or in a flat surface of the conversion crystal, configured to increase the intensity of the scattered portion of the fluorescent radiation.

2. The ultraviolet radiation control system of claim 1, wherein:
   the at least one diffusive surface is disposed spatially close to the plurality of photodetectors.

3. The ultraviolet radiation control system of claim 2, wherein:
   the conversion crystal comprises a disk shape; and
   the plurality of photodetectors are evenly spaced about an annular peripheral edge of the conversion crystal.

4. The ultraviolet radiation control system of claim 3, wherein:
   the at least one diffusive surface comprises a ring shape.

5. The ultraviolet radiation control system of claim 3, wherein:
   the at least one diffusive surface comprises a plurality of segments arranged in a discontinuous ring shape, each of the plurality of segments being located adjacent a given one of the plurality of photodetectors.

6. The ultraviolet radiation control system of claim 3, wherein:
   the plurality of photodetectors are disposed at a first side of the conversion crystal; and
   the at least one diffusive surface is disposed at a second side of the conversion crystal that is opposite to the first side.

7. The ultraviolet radiation control system of claim 3, wherein:
   the plurality of photodetectors are disposed at a first side of the conversion crystal; and
   the at least one diffusive surface is disposed at the first side of the conversion crystal.

8. The ultraviolet radiation control system of claim 3, wherein:
   the plurality of photodetectors are disposed at a first side of the conversion crystal; and
   the at least one diffusive surface comprises a first diffusive surface disposed at the first side of the conversion crystal, and a second diffusive surface is disposed at a second side of the conversion crystal that is opposite to the first side.

9. The ultraviolet radiation control system of claim 3, wherein:
   the plurality of photodetectors are disposed so as to surround the annular peripheral edge of the conversion crystal; and
   the at least one diffusive surface is located at the annular peripheral edge of the conversion crystal.

10. The ultraviolet radiation control system of claim 1 comprising only a single conversion crystal.

11. The ultraviolet radiation control system of claim 1, wherein:
    the ultraviolet radiation is a deep ultraviolet radiation.

12. The ultraviolet radiation control system of claim 11, wherein:
    the ultraviolet radiation is a branched beam from a 193 nm excimer pulsed laser.

13. The ultraviolet radiation control system of claim 1, wherein:
    the plurality of photodetectors are disposed on a ring shaped spacer that is disposed on an insulator.

14. The ultraviolet radiation control system of claim 13, further comprising:
    a light dump or a mirror located in a center of the ring shaped spacer and configured to reflect a portion of the ultraviolet radiation transmitted from the conversion crystal back to the conversion crystal to increase an amount of fluorescent radiation converted from the ultraviolet radiation.

15. The ultraviolet radiation control system of claim 13, wherein:
    the housing is configured to protect the conversion crystal and the plurality of photodetectors; and
    the system further comprises:
      a purge cap fixed on the housing, and
      a purge channel located within the purge cap or between the housing and the purge cap.

16. The ultraviolet radiation control system of claim 15, further comprising:
    a first seal, a plurality of springs, and a crystal spring holder arranged between the purge cap and the insulator.

17. The ultraviolet radiation control system of claim 16, further comprising:
    a second seal and a centering O-ring arranged between the conversion crystal and the housing.

18. The ultraviolet radiation control system of claim 1, wherein:
    the at least one diffusive surface includes impurities embedded in a layer of the conversion crystal configured to scatter the fluorescent radiation.

19. A lithographic apparatus, comprising the ultraviolet radiation control system of claim 1.

20. A method for detecting radiation, comprising:
    receiving ultraviolet radiation at a conversion crystal, wherein the conversion crystal is configured to convert the ultraviolet radiation to a fluorescent radiation; and
    detecting an intensity of a scattered portion of the fluorescent radiation using a plurality of photodetectors, wherein at least one diffusive surface is disposed on or in a flat surface of the conversion crystal to increase the intensity of the scattered portion of the fluorescent radiation.

* * * * *